United States Patent

Karthaus et al.

(10) Patent No.: US 8,179,294 B2
(45) Date of Patent: May 15, 2012

(54) APPARATUS AND METHOD FOR THE CALIBRATION OF DELTA-SIGMA MODULATORS

(75) Inventors: Udo Karthaus, Neu-Ulm (DE); Stephan Ahles, Erbach (DE)

(73) Assignee: Ubidyne, Inc., Wilmington, DE (US)

( * ) Notice: Subject to any disclaimer, the term of this patent is extended or adjusted under 35 U.S.C. 154(b) by 0 days.

(21) Appl. No.: 12/566,066

(22) Filed: Sep. 24, 2009

(65) Prior Publication Data

US 2010/0073208 A1    Mar. 25, 2010

Related U.S. Application Data

(60) Provisional application No. 61/099,996, filed on Sep. 25, 2008.

(30) Foreign Application Priority Data

Sep. 25, 2008  (GB) .................... 0817569.7

(51) Int. Cl.
    *H03M 3/00*    (2006.01)
(52) U.S. Cl. ............ 341/143; 341/118; 341/120; 331/3; 331/16; 331/44; 331/175; 331/176
(58) Field of Classification Search ............... 341/118, 341/120, 143; 331/3, 16, 44, 175, 176, 177 V
    See application file for complete search history.

(56) References Cited

U.S. PATENT DOCUMENTS

| | | | |
|---|---|---|---|
| 4,476,445 A * | 10/1984 | Riley, Jr. ............................ 331/3 |
| 5,729,230 A * | 3/1998 | Jensen et al. .................. 341/143 |
| 6,271,781 B1 * | 8/2001 | Pellon ............................ 341/143 |
| 6,323,739 B1 * | 11/2001 | Andrews ..................... 331/117 R |
| 6,750,733 B1 * | 6/2004 | Dunsmore et al. ........... 333/17.1 |
| 6,822,562 B2 * | 11/2004 | Poirier et al. .................. 340/445 |
| 6,897,796 B2 * | 5/2005 | Dias et al. ...................... 341/143 |
| 7,034,727 B2 * | 4/2006 | Xu ................................. 341/143 |
| 7,034,728 B2 * | 4/2006 | Luh et al. ....................... 341/143 |
| 7,193,546 B1 | 3/2007 | Melanson |
| 7,307,564 B1 * | 12/2007 | Kaplan ......................... 341/143 |
| 7,312,665 B2 * | 12/2007 | Ota et al. ......................... 331/16 |
| 7,498,884 B2 * | 3/2009 | Kwon et al. ................... 331/1 R |

(Continued)

FOREIGN PATENT DOCUMENTS

EP    458515    11/1991

(Continued)

OTHER PUBLICATIONS

UK Search Report issued Jan. 9, 2009.

(Continued)

*Primary Examiner* — Linh Nguyen
(74) *Attorney, Agent, or Firm* — Stephen H. Eland; Dann, Dorfman, Herrell & Skillman (57) ABSTRACT

The application relates to a calibration apparatus and calibration method for a tuneable resonator of a delta-sigma modulator of the continuous time, band pass type. The calibration apparatus comprises: a resonator driver capable of causing an oscillating behavior in a resonator output signal, a reference signal source that provides a reference signal, a frequency detector that provides a frequency relation signal corresponding to the frequency relation between the resonator output signal and the reference signal, and a controller that controls the tuneable resonator in dependence from the frequency relation signal so as to reduce frequency deviation.

14 Claims, 7 Drawing Sheets

U.S. PATENT DOCUMENTS

| | | | |
|---|---|---|---|
| 7,689,193 B2 * | 3/2010 | Lester et al. | 455/307 |
| 7,894,536 B2 * | 2/2011 | Risbo et al. | 375/243 |
| 2007/0188254 A1 * | 8/2007 | Sutardja | 331/176 |

FOREIGN PATENT DOCUMENTS

| | | |
|---|---|---|
| EP | 132497 | 12/2001 |
| EP | 1890383 | 2/2008 |
| EP | 1933460 | 6/2008 |
| GB | 243056 | 11/1925 |
| WO | 2004/070949 | 8/2004 |

OTHER PUBLICATIONS

UK Examination Report for UK Application No. 0817569.7 issued Mar. 14, 2012.

* cited by examiner

APPARATUS AND METHOD FOR THE CALIBRATION OF DELTA-SIGMA MODULATORS

CROSS-REFERENCE TO RELATED APPLICATIONS

This application claims the priority of U.S. Provisional Application No. 61/099,996 and UK Patent Application GB 0817569.7, both filed on Sep. 25, 2008. The entire disclosure of the foregoing applications is incorporated herein by reference.

FIELD OF THE INVENTION

The field of the application relates to a calibration apparatus for a resonator of a continuous time, band pass delta-sigma modulator (CT BP DSM) and to a method for calibrating a resonator of a continuous time, band pass delta-sigma modulator. The field of the application also relates to a computer program product enabling a processor to carry out the calibration method and to a computer program product useable for the manufacture of the calibration apparatus. Moreover, the field of the application relates to a delta-sigma modulator comprising a calibration apparatus.

BACKGROUND OF THE INVENTION

Continuous time delta sigma modulators comprise a continuous-time loop filter rather than the more common switched-capacitor filter. Continuous-time delta-sigma modulators offer inherent protection against signal aliasing and less noisy virtual ground nodes at the input. A further advantage is that modulator clock rates can be raised, because settling time restrictions are relaxed. Resonance frequencies and quality factors of resonators in continuous time, bandpass resonators are subject to process and temperature variations. The behaviour of a DSM is very sensitive to these parameters. Therefore, they need to be calibrated, at least once during the manufacturing process, or even on a regular basis.

European Patent Application EP 1 933 460 A1 describes an analogue RF device for wireless communication. The device includes, inter alia, a tuneable bandpass filter which receives test signals from a controller and reacts by returning scattered signals to the controller. The controller determines a frequency dependence of a scattering parameter of the bandpass filter. The controller adjusts the tuneable bandpass filter in order to tune the bandpass filter to a desired frequency dependence of at least one scattering parameter. Measuring scattering parameters over a frequency range is, however, a complicated task and requires a high degree of accuracy, as well as appropriate equipment. For many applications this would be prohibitive. Usually, the determination of the resonance frequency and the quality factor of the bandpass filter is sufficient for a large number of applications. The entire disclosure of EP 1 933 460 A1 is hereby incorporated by reference into the description.

U.S. Pat. No. 7,193,546 (issued to Melanson, assigned to Cirrus Logic, Inc.) discloses a phase-measuring delta-sigma modulator calibration method and apparatus. The apparatus disclosed in the '546 patent comprises a signal generator that is external to the delta-sigma modulator. The signal generator output is injected into the quantizer of the delta-sigma modulator as an artificial quantization error. By direct comparison of the output of the delta-sigma modulator with the output of the signal generator it is possible to determine the response of the modulator to quantization noise, or in other words, measure the noise transfer function (NTF). The method according to the '546 patent does not disclose that a component of the delta-sigma modulator, such as a resonator, is caused to oscillate and that the frequency of the oscillation is compared to a reference frequency. The entire disclosure of U.S. Pat. No. 7,193,546 is hereby incorporated by reference into the description.

SUMMARY OF THE INVENTION

It would be desirable to facilitate the calibration of resonators in continuous time, bandpass delta-sigma modulators. To better address this concern and/or other concerns, in a first aspect of the teachings herein a calibration apparatus for a resonator of a delta-sigma modulator of the continuous time, band pass type is proposed. The resonator to be calibrated may comprise a tuneable component. The calibration apparatus comprises a resonator driver, a reference signal source, a frequency detector, and a controller. The resonator driver is capable of causing an oscillating behaviour in a resonator output signal. The reference signal source provides a reference signal. The frequency detector provides a frequency relation signal corresponding to the frequency relation between the resonator output and the reference signal. The controller controls the tuneable resonator, or the tuneable component thereof, in dependence from the frequency relation signal so as to reduce frequency deviation. The controller may be implemented in any suitable way, e.g. as an analogue controller, a digital controller, or a programmable microcontroller.

To better address the above mentioned concern and/or other concerns, in a second aspect of the teachings herein a computer program product is proposed that is embodied on a computer readable medium and comprises executable instructions for the manufacture of the above mentioned calibration apparatus.

To better address the above mentioned concern and/or other concerns, in a third aspect of the teachings herein a method for calibrating a resonator of a delta-sigma modulator of the continuous time, bandpass type is proposed. The resonator to be calibrated may comprise a tuneable component. The method comprises the following actions:
  causing a resonator output signal to oscillate at an oscillation frequency of the resonator;
  providing a reference signal having a desired frequency or a fraction thereof;
  detecting a frequency deviation between the oscillation frequency and the desired frequency or the fraction thereof;
  determining tuning commands for the tuneable resonator, or the tuneable component thereof, in dependence from the frequency deviation signal so as to reduce frequency deviation.

To better address the above mentioned concern and/or other concerns, in a fourth aspect of the teachings herein, a computer program product is proposed that comprises instructions that enable a processor to carry out the above mentioned method.

In an aspect of the teachings herein, the resonator driver is a transconductance stage connected in parallel to the resonator. In another aspect of the teachings herein, the resonator driver is a transimpedance stage connected in series to the resonator. Transconductance stages and transimpedance stages may be used as so called quality enhancement elements that compensate the losses of an LC resonator. During a calibration phase, the quality enhancement elements can be used as resonator drivers, e.g. by providing a feedback for the resonator, thereby causing the resonator to oscillate at or close to its resonance frequency.

It would be further desirable to achieve a calibration apparatus that can calibrate the resonator to a frequency that is different from the reference frequency, in particular a multiple of the reference frequency. In an embodiment, this concern is addressed by the calibration apparatus further comprising a frequency divider that receives the resonator output signal and provides a frequency divided resonator signal to the frequency detector.

It would also be desirable to achieve a calibration apparatus that gradually improves the calibration of the resonator. In an embodiment, this aspect is addressed by the controller being configured to perform a successive approximation algorithm for determining a control signal provided to the tuneable resonator, or the tuneable component thereof In the case of a method for calibrating a resonator, the action of controlling the tuneable resonator or the tuneable component may comprise performing a successive approximation algorithm.

It would also be desirable to achieve a calibration apparatus that is capable of determining an optimal degree of the quality enhancement. During normal operation (as opposed to calibration operation) of the delta-sigma modulator, the resonator should not begin to oscillate on its own, but rather merely filter an input signal according to the resonator's amplitude response and phase response. In an embodiment, this concern is addressed by the calibration apparatus further comprising an oscillation detector that receives the resonator output signal and provides an oscillation indicative signal to the controller. The controller determines a resonator driver command that adjusts the resonator driver to a setting close to a stability limit of the resonator. The function of the oscillation detector can be performed by the frequency detector or by a dedicated component. In the case of a method for calibrating a resonator, the method may comprise
  detecting a presence of an oscillation in the resonator output signal;
  providing an oscillation indicative signal;
  determining a resonator excitation setting, the resonator excitation setting being close to a stability limit of the resonator.

The resonator excitation setting may be the quality enhancement setting of a quality enhancement circuit.

It would further be desirable to achieve a calibration apparatus that can use an external reference signal. In an embodiment, this concern is addressed by the reference signal source comprising a phase-locked loop. The phase-locked loop recovers the reference signal even when it may be distorted due to the transmission from an external reference signal generator to the calibration apparatus.

It would be further desirable to achieve a delta-sigma modulator of the continuous-time, band pass type that can be tuned in a simple manner and on a regular basis. To better address this concern and/or other concerns, a delta-sigma modulator comprises a tuneable resonator and a calibration apparatus as described above.

These and other aspects of what is taught will be apparent from and elucidated with reference to the embodiment(s) described herein after.

DETAILED DESCRIPTION OF THE EMBODIMENTS

For a complete understanding of what is taught and the advantages thereof, reference is now made to the following detailed description taken in conjunction with the Figures.

It should be appreciated that the various aspects of what is taught are merely illustrative of the specific ways to make and use the disclosed apparatus, method and computer-program product and do not therefore limit the scope of the disclosed apparatus, method and computer-program product when taken into consideration with the claims and the following detailed description. It will also be appreciated that features from one embodiment may be combined with features from another embodiment.

Figure 1:
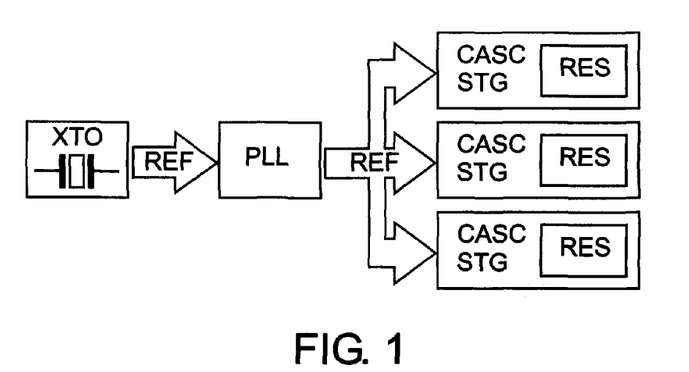
FIG. 1 shows a schematic overview of elements that are involved in the calibration.

FIG. 1 shows the general context of a calibration apparatus as described herein. A continuous-time, band pass delta-sigma modulator comprises one or more resonators RES that form a substantial part of the loop filter. Depending on the design of the delta-sigma modulator, each resonator could be arranged in a cascadable stage CASC STG. In order to tune the resonators RES, each cascadable stage may receive a reference signal REF from a reference signal source, which is a phase-locked loop PLL in the case depicted in FIG. 1. The phase-locked loop PLL may itself receive a reference signal from a quartz oscillator XTO which is capable of providing a highly accurate timing signal. This hierarchy accurately distributes the reference signal to the various resonators so that every resonator receives its reference signal from the same source.

Figure 2:
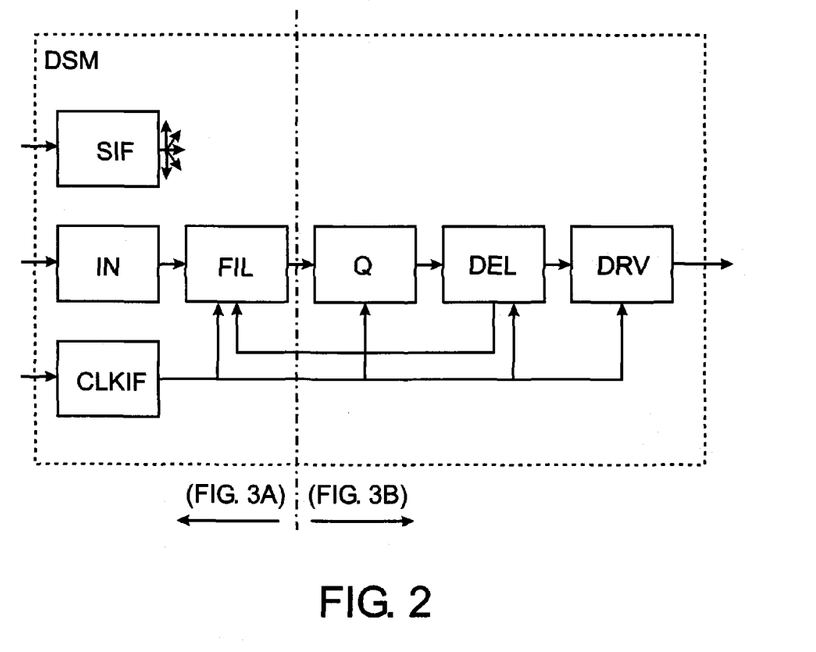
FIG. 2 shows a schematic block diagram of a delta-sigma modulator.

FIG. 2 shows a schematic view of a delta-sigma modulator DSM which comprises one or more resonators that need to be tuned so that the delta-sigma modulator operates at the desired frequency and the desired bandwidth. A signal to be modulated is received at an input block IN of the delta-sigma modulator e.g. for signal adaptation or signal conditioning. An output of the input block IN is connected to a filter block FIL which forms the loop filter of the delta-sigma modulator. To the right of the filter block FIL there is provided a quantizer Q and subsequently a delay DEL. Finally, a driver DRV produces a delta-signal modulated signal that can be used by equipment downstream of the delta-sigma modulator. A feedback loop is provided between the delay DEL and the filter FIL.

The delta-sigma modulator also comprises a clock interface CLKIF. The clock interface CLKIF receives a clock signal from an external reference and produces one or more clock signals that are needed within the delta-sigma modulator. The clock signal is distributed for example to the filter FIL, the quantizer Q, the delay DEL, and/or the driver DRV.

The quantizer Q may be a clocked quantizer or a clockless quantizer. The operation of a clockless quantizer is not controlled by the clock signal, but substantially by the quantizer input signal.

Furthermore, the delta-sigma modulator depicted in FIG. 2 comprises a serial interface SIF which receives external commands relative to the operation of the delta-sigma modulator, such as center frequency, bandwidth, filter order, activation state of the clockless quantizer (if present), and parameters of the driver DRV.

Figure 3A:
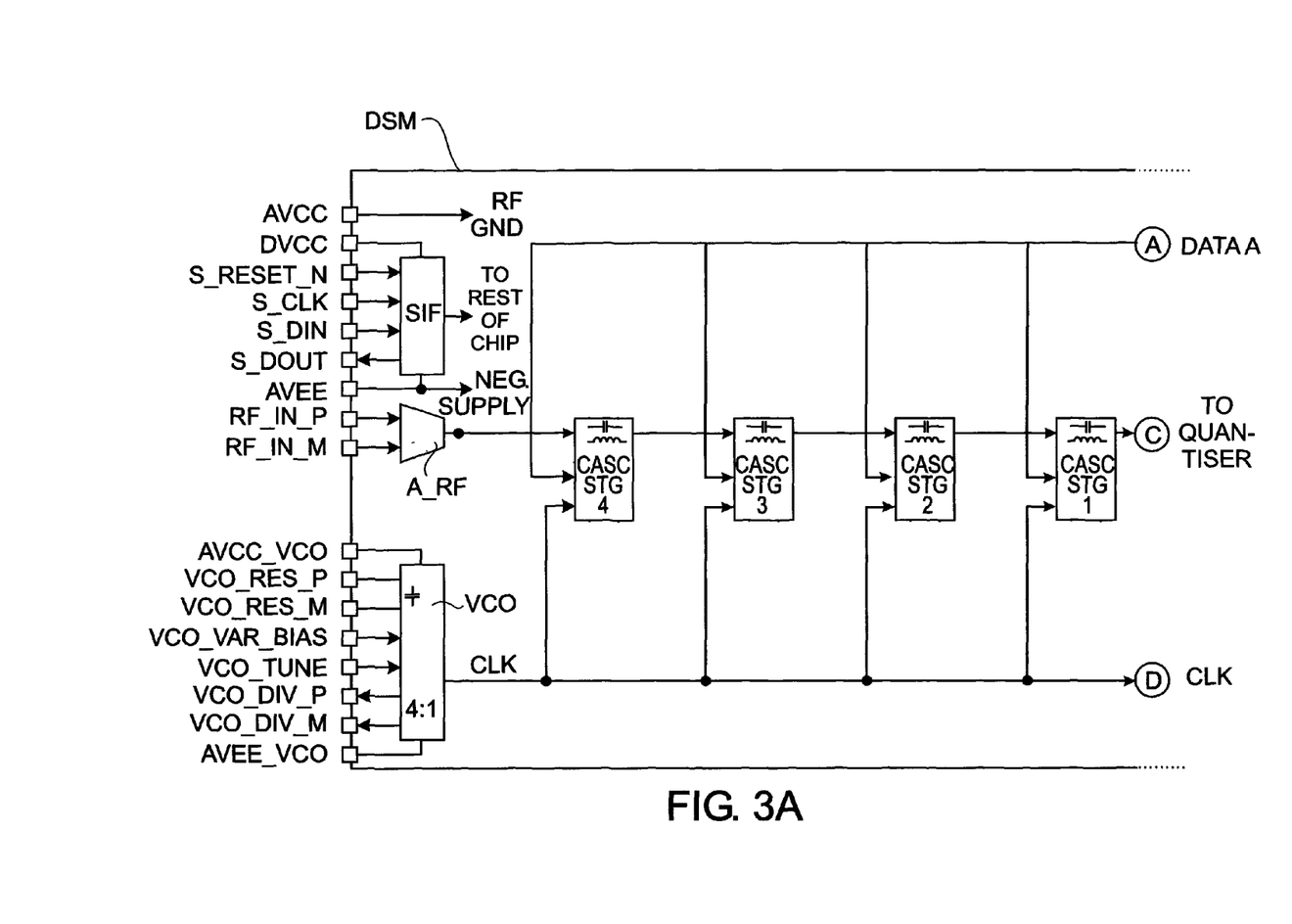
FIGS. 3A and 3B show a more detailed block diagram of the delta-sigma modulator illustrated in FIG. 2.
Figure 3B:
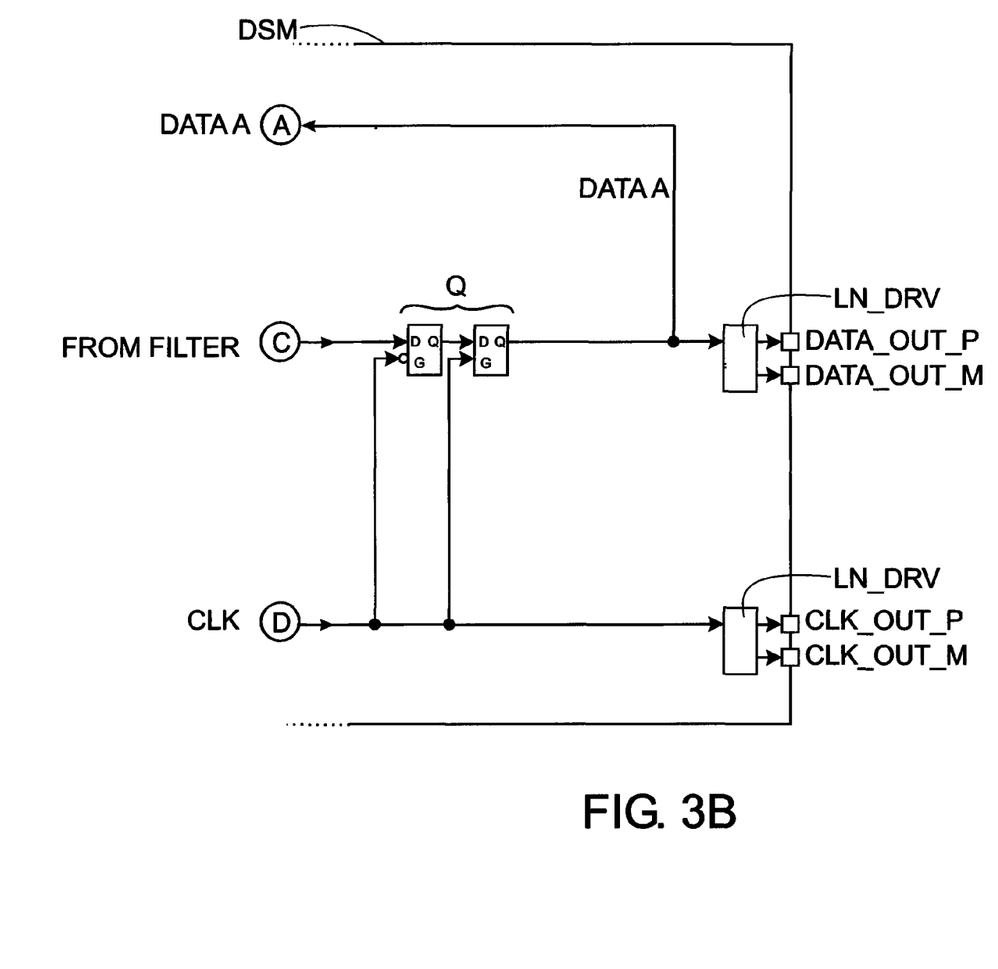

The details of the delta-sigma modulator are shown in FIGS. 3A and 3B.

FIG. 3A shows details of the input block IN, the filter FIL, and the serial interface SIF of the delta-sigma modulator DSM. The delta-sigma modulator has the following inputs/outputs shown in FIG. 3A:

| | |
|---|---|
| AVCC | analogue supply potential Vcc and radio frequency ground |
| DVCC | digital supply potential Vcc |
| S_RESET_N | serial reset |
| S_CLK | serial clock |
| S_DIN | serial data in |
| S_DOUT | serial data out |
| AVEE | analogue supply potential Vee (also a ground for digital signals) |
| RF_IN_P | radio frequency input signal, + |
| RF_IN_M | radio frequency input signal, − |
| AVCC_VCO | analogue supply potential Vcc for VCO |
| VCO_RES_P | VCO resonator, + |
| VCO_RES_M | VCO resonator, − |
| VCO_VAR_BIAS | bias voltage for VCO varactor |
| VCO_TUNE | tuning voltage for VCO |
| VCO_DIV_P | output for frequency divided VCO signal, + |
| VCO_DIV_M | output for frequency divided VCO signal, − |
| AVEE_VCO | analogue supply potential Vee for VCO |

It should be noted that for clarity reasons not all of the interior connections are shown in FIG. 3A, as well as other figures.

In the following, the main path of the signal to be modulated will be described. Typically, an analogue radio frequency signal arrives at the ports RF_IN_P and RF_IN_M and is then passed on to an amplifier for radio frequency signals A_RF. The amplified signal continues to one of the cascadable stages of the loop filter, namely cascadable stage number 4: CASC STG 4. Each cascadable stage comprises a resonator having one or more capacitors and one or more inductors. While the capacitor and the inductor of the resonator are depicted as being integrated in the cascadable stage, the capacitor and/or inductor of each cascadable stage could be an external component. An exemplary cascadable stage will be described more in detail in connection with FIG. 4.

The resonator of each cascadable stage CASC STG 1-CASC STG 4 accepts an electric current at its input and provides an electric voltage at its output. For this reason, transconductance amplifiers GM are provided within the cascadable stages (not visible in FIG. 3A). The transconductance amplifiers can be activated and deactivated individually so that selected ones of the cascadable stages can be bypassed. This allows selecting the filter order of the delta-sigma modulator, for example between fourth order, sixth order, and eighth order. In delta-sigma modulator depicted in FIG. 3A two of the four cascadable stages can be bypassed, namely CASC STG 2 and/or CASC STG 3. This flexible filter structure of a delta-sigma modulator is described in UK patent application no. 0811896.0 and U.S. patent application No. 61/076,843, both filed by the applicant. Cascadable stage CASC STG 1 is the last in the chain of cascadable stages and provides its input signal to a quantizer (cf. FIG. 3B via connection point C). It should be noted that the number of four cascadable stages is purely exemplary.

Turning now to FIG. 3B, the remaining parts of the delta-sigma modulator are shown. The quantizer Q consists of two latches. The two latches are connected to a clock signal CLK. The output of the second D-flip-flop forms the feedback signal DATA A for the delta-sigma modulator and is passed back to the filter and the cascadable stages CASC STG 1-4 via connection point A. The connection points A, C, and D are provided for illustrative purposes, only.

The output of the delta-sigma modulator DSM is tapped at the Q gate of the second D-flip-flop. A line driver LN DRV is used for conditioning the output signal in accordance with the subsequent circuitry. The line driver LN DRV has two output ports DATA_OUT_P and DATA_OUT_M.

In addition to the input and output ports mentioned earlier, the delta-sigma modulator further has the following output ports:

| | |
|---|---|
| DATA_OUT_P | delta-sigma modulated signal output, + |
| DATA_OUT_M | delta-sigma modulated signal output, − |
| CLK_OUT_P | clock output, + |
| CLK_OUT_M | clock output, − |

Turning back to FIG. 3A, a serial interface block SIF is provided that receives commands on port S_DIN in a serial format from a control unit and translates them into specific settings of parameters internal to the delta-sigma modulator. Examples are the activation states of the transconductance amplifiers (not depicted in FIG. 3A), of the clockless quantizer (if present), and of the line driver LN DRV or the CMOS driver CMOS DRV. The serial interface may also transmit data in the serial format to external components via its serial output port S_DOUT.

Figure 7:
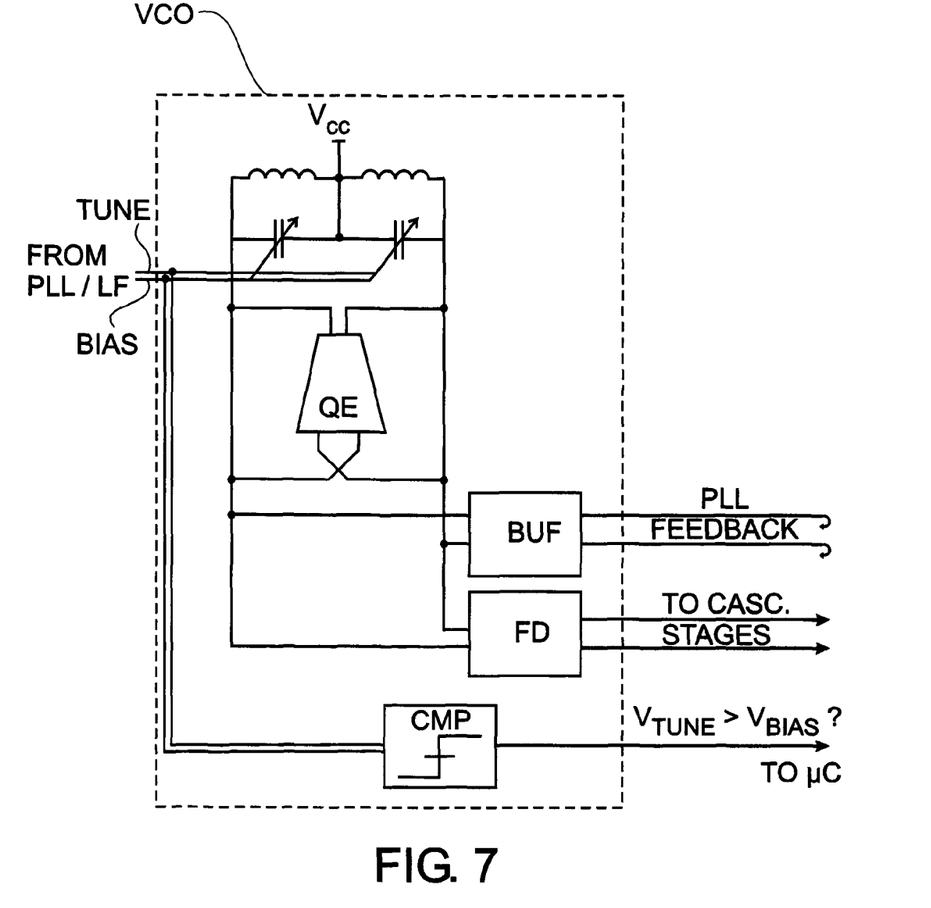
FIG. 7 shows a partial block diagram of a voltage controlled oscillator within the phase-locked loop.

A voltage-controlled oscillator VCO provides the internal clock signal CLK for the delta-sigma modulator. The clock signal CLK is distributed to the cascadable stages CASC STG 1-4, the quantizer Q, and the clock output driver LN DRV. The clock output line driver LN DRV has two ports, CLK_OUT_P and CLK_OUT_M. The input for the voltage controlled oscillator is provided via the ports VCO_VAR_BIAS and VCO_TUNE. The voltage-controlled oscillator provides a frequency divided signal to external components at its outputs VCO_DIV_P and VCO_DIV_M. FIG. 7 shows a more detailed illustration of the voltage controlled oscillator VCO.

Figure 4:
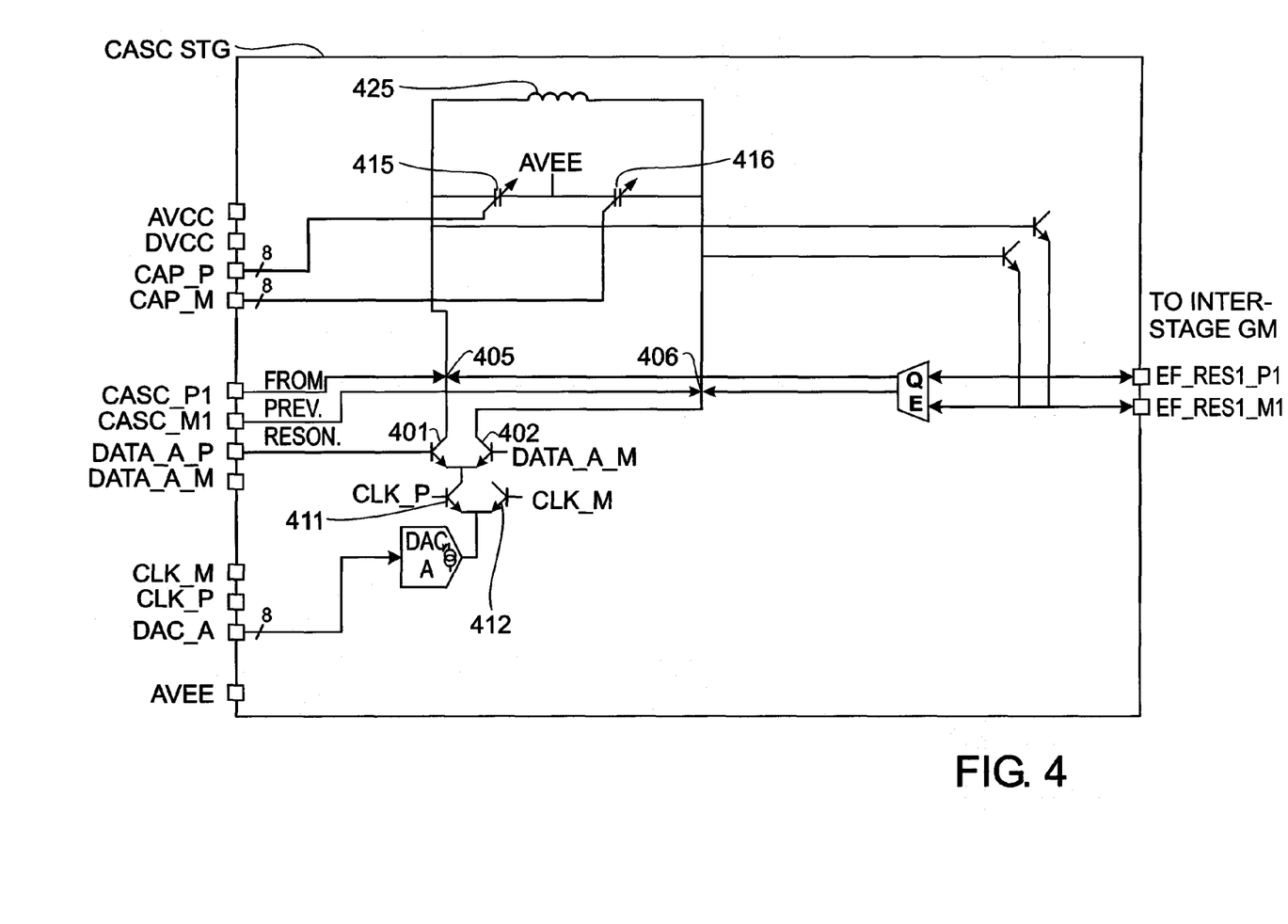
FIG. 4 shows a detailed block diagram of a cascadable stage, wherein calibration features are note shown.

FIG. 4 shows a block diagram of a cascadable stage CASC STG. The cascadable stage has the following ports (not all internal connections are illustrated for reasons of clarity):

| | |
|---|---|
| AVCC | analogue Vcc |
| DVCC | digital Vcc |
| CAP_P | capacitor setting, +, 8 bit |
| CAP_M | capacitor setting, −, 8 bit |
| CASC_P1 | signal input from previous cascadable stage, + |
| CASC_M1 | signal input from previous cascadable stage, − |
| DATA_A_P | feedback signal DATA A, + |
| DATA_A_M | feedback signal DATA A, − |
| CLK_P | clock signal, + |
| CLK_M | clock signal, − |
| DAC_A | setting for current source A, 8 bit |
| AVEE | analogue Vee |
| EF_RES1_P1 | emitter follower of resonator 1, + |
| EF_RES1_M1 | emitter follower of resonator 1, − |

The cascadable stage usually provides the following functions: 1) multiplying the feedback signal with a predetermined coefficient, 2) adding feedback signal and incoming signal, and 3) filtering the sum signal in accordance with the frequency response of a resonator.

The feedback signal enters the cascadable stage via ports DATA_A_P, DATA_A_M. Note that these are digital signals. Each of the digital feedback signals is used to turn on and off a respective one of two transistors 401, 402. Another set of two transistors 411, 412 is controlled by clock signals CLK_P and CLK_M to synchronize the feedback signals to the clock signal. Transistor 412 is one of the transistors of a differential pair that maintains a current flow to/from the current source DAC A when transistor 411 (the actual working transistor) is non conducting. The current source DAC can be adjusted to a particular intensity of electric current by means of the seven bit input signal DAC_A. The intensity of electric current represents the coefficient by which the binary digital feedback signal (i.e. either "1" or "0") has to be multiplied. Thus, the action of multiplication is subdivided into two smaller tasks, namely switching a current on and off (transistors 401, 402) and adjusting a constant current (current source DAC A). Multiplication of the feedback signal with a coefficient is therefore relatively simple and cheap to implement, but nevertheless suitable for high frequency applications. The result of the multiplication is an electric current of a particular strength, which is switched on when the value of the feedback signal is "1". The feedback signal may have a resolution higher than one bit so that the feedback signal may assume more than two discrete values.

Adding the electric current representing the feedback signal to the electric current representing the input signal is provided just above transistors 401 and 404 at the two current summation points 405 and 406, respectively. The electric current representing the input signal enters the cascadable stage via ports CASC_P1 and CASC_M1. This electric current may come from a previous resonator/cascadable stage or from the input amplifier A_RF (FIG. 3A). The sum current flows above the current summation points 405 and 406 in FIG. 4.

The resonator is depicted in the upper part of FIG. 4. The capacitors of the resonator are adjustable by means of control signals CAP_P and CAP_M (8 bit signals). A sum current flows from summation point 405 to the resonator. The sum current is an alternating current with a high frequency. The resonator produces a corresponding output voltage in accordance with its transfer function, the frequency response of which shows a peak at or close to its resonance frequency. The resonance frequency can be altered by adjusting the capacitance of the capacitors. The output voltage is tapped just beneath the resonator in FIG. 4, passed on to a emitter follower transistor (upper right part in FIG. 4), and then on to the output ports EF_RES1_P1, EF_RES1_M1. A quality enhancement circuit QE is also provided. The quality enhancement circuit QE is an on-chip negative transconductance stage to compensate for the finite quality factor Q of the resonator. The quality enhancement circuit QE provide a current proportional to the output voltage of the resonator back to the current summation point 405.

Figure 5:
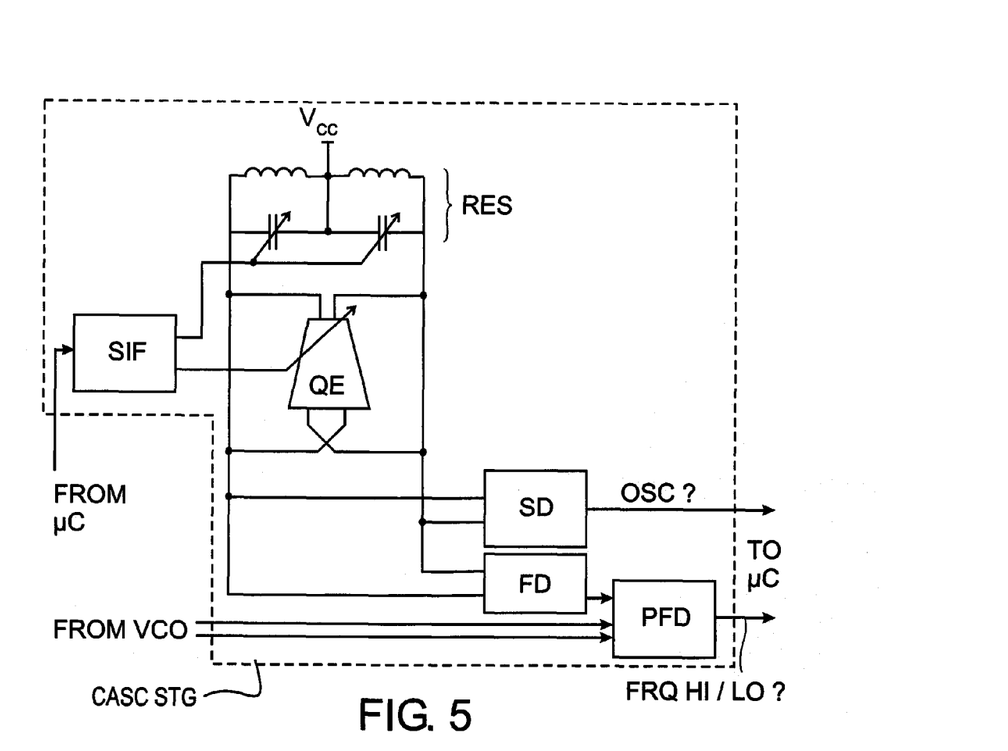
FIG. 5 shows a schematic block diagram of a cascadable stage with a focus on the calibration features.

Turning now to FIG. 5, a more schematic, partial block diagram of a cascadable stage CASC STG is shown. FIG. 5 focuses on the calibration features of a cascadable stage. It can be seen that the serial interface SIF is used to control the adjustment of the capacitors and also of the quality enhancement circuit QE. The serial interface SIF receives the commands regarding capacitance adjustment from a microcontroller μC (not shown).

During the calibration process, the quality enhancement circuit QE is used as a resonator driver capable of causing an oscillating behaviour in the resonator output voltage. This is achieved by increasing the gain of the quality enhancement circuit QE to a sufficiently high value to cause instability in the circuit comprising the resonator and the QE. This instability causes an oscillation of the resonator. The oscillation signal is picked up by an optional frequency divider FD and the frequency divided signal (or the original resonator signal if no frequency divider is present) is passed on to a phase frequency detector PFD. The other input of the phase frequency detector PFD is connected to a clock signal which generally is provided by a voltage controlled oscillator VCO and a phase-locked loop PLL. The VCO input connected to the second input of the phase frequency detector PFD is (optionally) also divided in frequency. The phase frequency detector PFD determines whether the resonator signal has a higher or a lower frequency than the VCO signal. The phase frequency detector PFD produces a corresponding output "FRQ HI/LO ?" which is transmitted to the microcontroller μC (not shown). In addition to the phase frequency detector PFD, a stability detector SD can be provided. The stability detector SD is capable of determining whether the resonator is oscillating or not and produces a corresponding output signal "OSC ?". The stability detector output signal "OSC ?" is also transmitted to the microcontroller μC. The microcontroller can then try different values for the capacitance parameter, e.g. by a successive approximation algorithm, until the resonance frequency is at the desired frequency.

For example, in 4:3 mode, the VCO clock frequency equals 4/3=1.333 times the desired DSM resonance frequency. The VCO frequency divider of FIG. 5 could be set to 16, and the frequency divider in the cascadable stages could be set to 12. In 4:1 mode, the frequency divider ratios are set to 16 and 4, for example.

It is also possible to perform a quality factor enhancement calibration procedure. During normal operation of the delta-sigma modulator, the Q enhancement transconductance QE should in general be set to value that maximizes the quality factor Q, without over-compensating the finite Q loss. This value can be determined in at least two ways:

1.) By using a stability detector SD. The microcontroller can—again using e.g. a successive approximation—find the largest transconductance value without oscillation of the resonator.

2.) By using the phase frequency detector PFD. If the reference clock (VCO) is set to a frequency that is definitively below the resonance frequency of the resonator(s), the PFD output state (high or low) will depend on whether the resonator oscillates or not.

Remark: Q enhancement calibration and resonance frequency calibration might have to be done together or iteratively alternating, since the uncompensated Q of the resonator and hence the optimum value of the Q enhancement transconductance value are frequency dependent.

Figure 6:
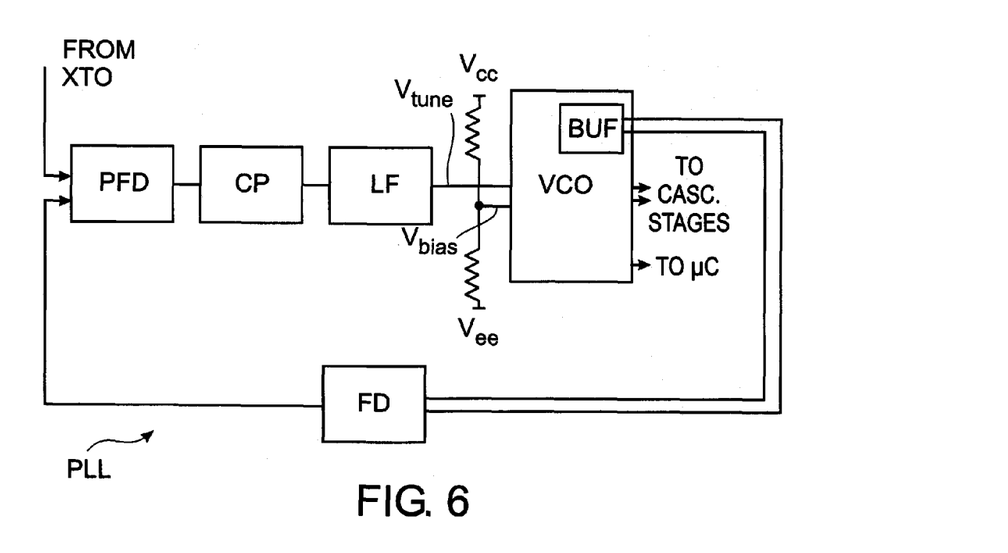
FIG. 6 shows a phase-locked loop that may optionally be used in a calibration apparatus according.

FIG. 6 shows a phase-locked loop PLL that is used to recover a clock signal produced by and transmitted from e.g. a remote quartz XTO. The quartz signal serves as an input of a phase frequency detector PFD. A PLL feedback signal is another input for the phase frequency detector PFD. The phase frequency detector PFD produces an output signal that reflects the phase and frequency differences between the quartz signal and the PLL feedback signal. The difference signal is transmitted to a charge pump CP and then to a loop filter LF. The loop filter LF produces an output voltage $V_{TUNE}$ which is provided to the voltage controlled oscillator VCO. Another input for the voltage controlled oscillator VCO is a bias voltage $V_{BIAS}$ which is produced by a voltage divider between Vcc and Vee. The difference between $V_{TUNE}$ and $V_{BIAS}$ determines the oscillation frequency of the voltage controlled oscillator VCO. An output signal of the voltage controlled oscillator VCO is provided to the cascadable stages. Another output signal, which will be explained in the context of FIG. 7, is provided to the microcontroller μC. The voltage controlled oscillator VCO also provides a feedback signal for the phase-locked loop PLL. The feedback signal passes a frequency divider FD and then enters the phase frequency detector PFD.

FIG. 7 shows the voltage controlled oscillator VCO that is used in the phase-locked loop PLL. The voltage controlled oscillator VCO receives two signals $V_{TUNE}$ and $V_{BIAS}$ controlling the setting of the VCO-internal resonator. The differential voltage $V_{TUNE}$-$V_{BIAS}$ determines the capacitance of capacitors or varactors that are used in the VCO resonator. As can be seen in FIG. 6, the signal $V_{TUNE}$ is produced by the loop filter LF of the phase locked loop PLL. The signal $V_{BIAS}$ is e.g. produced by a voltage divider as described above. The resonator of the VCO oscillates at a frequency that approximately corresponds to its resonance frequency. The oscillating frequency matches the resonance frequency only approximately because of the transconductance amplifier that provides a negative feedback to the resonator and causes the oscillating frequency to be slightly offset from the resonance frequency. The oscillating voltage of the resonator is picked up by a frequency divider FD and by a buffer that produces the feedback signal for the phase locked loop PLL. The output signal of the frequency divider FD is passed on to the cascadable stages. Furthermore, the voltage controlled oscillator VCO also comprises a voltage comparator CMP that compares the tuning voltage $V_{TUNE}$ to the biasing voltage $V_{BIAS}$ which is used for calibrating the digitally controllable portion of the variable capacitance of the voltage controlled oscillator VCO. The output signal "$V_{TUNE}$>$V_{BIAS}$ ?" of the voltage comparator CMP is provided to the microcontroller μC.

The VCO frequency calibration is for example as follows: The VCO has an external inductor and an integrated, tuneable capacitor. The capacitor consists of a large switched MIM (metal insulator metal) capacitor array and a small varactor. The switched capacitor array is a large digitally tuneable capacitance, the varactors are small analogue tuneable capacitance. The varactors tuning voltage is controlled by a PLL. Since this analogue tuning range is limited and does not cover process variations, the digital value should be chosen such that the analogue tuning voltage is approximately centred for the desired VCO clock frequency. The analogue tuning range does then cover frequency variations over temperature.

The method for the tuning of the digital control value of the capacitor array could be as follows:
  The VCO is powered on, the PLL is closed. An initial value for the digital control setting of the capacitor array is chosen.
  The PLL tries to set the tuning voltage at analogue varactor such that the VCO oscillates at the desired frequency.
  A simple voltage comparator compares this tuning voltage to the mid-range voltage.
  Depending on the result, a higher or lower value of the digital control value is chosen.
  Repeat, until the tuning voltage is mid-range, while the PLL is locked.

Figure 8:
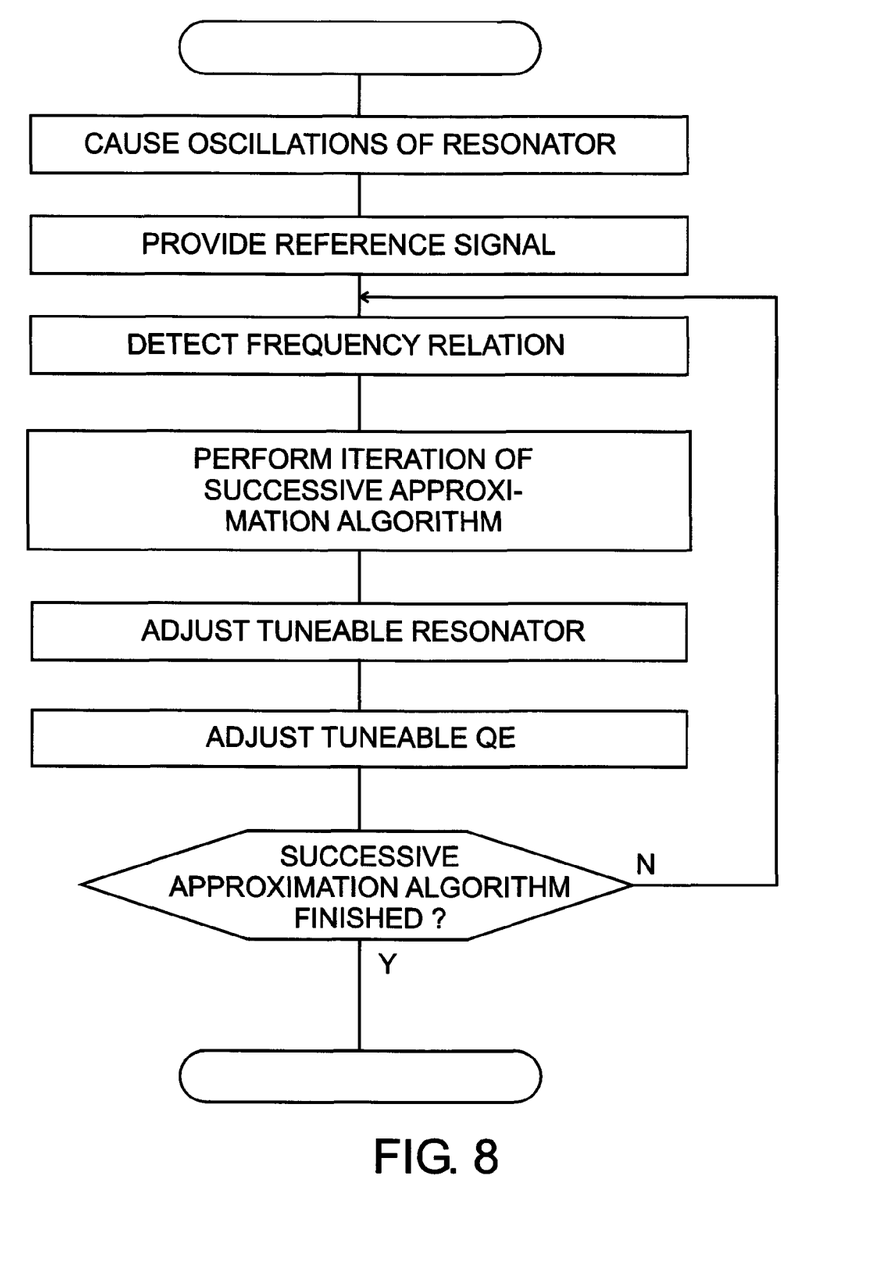
FIG. 8 is a flow chart of a method for calibrating a resonator of a continuous-time, band pass delta-sigma modulator.

FIG. 8 shows a flow chart of a method for calibrating a resonator of a continuous-time, band pass delta-sigma resonator. After the calibration method is started, the resonator is brought to a resonating state, for example by providing a strong feedback signal by means of a resonator driver. A circuit that substantially consists of the resonator and the resonator driver becomes instable and therefore starts to oscillate close to the natural frequency of the resonator. Another option for bringing the resonator to a resonating state would be to apply e.g. a step function at the input of the resonator. A reference signal is provided in the next action that is depicted in FIG. 8. Next, the frequency relation between the reference signal and the resonator output signal is determined. The frequency relation indicates, whether the oscillation frequency of the resonator is higher or lower than the desired frequency. The desired frequency equals the frequency of the reference signal or a multiple thereof. Depending on the result of the determination of the frequency relation, the resonator is adjusted in a bitwise fashion starting from the most significant bit of a data word that represents a setting of a tuneable component of the resonator. Thus, the tuneable resonator is successively adjusted so that its resonance frequency substantially matches the desired frequency. Substantially concurrently with adjusting the resonance frequency of the resonator, the tuneable quality enhancement circuit is also adjusted in each iteration. After that, the method reaches a branching point at which a determination is made whether the successive approximation algorithm is finished. The successive approximation algorithm is finished when the least significant bit has been set. If that is the case, the method ends. In the contrary case, the method continues to the action for detecting a frequency relation.

While various embodiments of the disclosed apparatus, method and computer-program product have been described above, it should be understood that they have been presented by way of example, and not limitation. It will be apparent to persons skilled in the relevant arts that various changes in form and detail can be made therein without departing from the scope of the what is taught. For example, any bipolar transistors depicted in the drawings and/or described in the text could be field effect transistors, and vice versa. The resonators need not be a LC-type resonator, but also any other type of suitable resonator, such as a tank, a cavitiy resonator, transmission line resonator, or a surface wave resonator. In addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analog-based medium). Embodiments of the disclosed apparatus, method and computer-program product may include methods of providing the apparatus described herein by providing software describing the apparatus and subsequently transmitting the software as a computer data signal over a communication network including the Internet and intranets.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, what is disclosed should not be limited by any of the above-described exemplary embodiments, but should be defined only in accordance with the following claims and their equivalents.

LIST OF REFERENCE SIGNS (IN ALPHABETICAL ORDER)

μC microcontroller
401, 402 feedback signal switching transisitors
405, 406 current summation points
411, 412 clock switching transistor
421, 422 resonator enable/disable transistors
A_RF analogue radio frequency input amplifier A_RF
AVCC analogue Vcc
AVCC_VCO analogue supply potential Vcc for VCO
AVEE analogue Vee
AVEE_VCO analogue supply potential Vee for VCO
BIAS biasing signal
BUF buffer
CAP_M capacitance setting, 8bit, −
CAP_P capacitance setting, 8bit, +
CASC STG cascadable stage
CASC_M1 signal input from previous cascadable stage, −
CASC_P1 signal input from previous cascadable stage, +
CLK clock
CLK_M clock, −
CLK_OUT_M clock output port −
CLK_OUT_P clock output port +
CLK_P clock, +
CLKIF clock interface
CMOS_DRV cmos driver
CMP comparator
CP charge pump
DAC A digital-to-analogue converter A (current source)
DAC_A setting for current source (digital-to-analogue converter) A
DATA A feedback signal A
DATA_A_M feedback signal DATA A, −
DATA_A_P feedback signal DATA A, +
DATA_OUT_M line driver output port; −
DATA_OUT_P line driver output port; +
DEL delay element
DRV driver
DSM delta-sigma modulator
DVCC digital Vcc
EF_RES1_M1 emitter follower of resonator 1, −
EF_RES1_P1 emitter follower of resonator 1, +
FD frequency divider
FIL filter
FRQ HI/LO ? signal frequency higher/lower than reference frequency
IN input block
LF loop filter
LN_DRV line driver
OSC? signal oscillations yes/no ?
PFD phase frequency detector
PLL phase-locked loop
Q quantizer
QE quality enhancement circuit (transconductance amplifier)
REF reference signal
RES resonator
RF GND radio frequency ground
RF_IN_M radio frequency input signal, −
RF_IN_P radio frequency input signal, +
S_CLK serial clock
S_DIN serial data in
S_DOUT serial data out
S_RESET_N serial reset
SD stability detector
SIF serial interface
TUNE tuning signal
VBIAS biasing voltage
VCO voltage controlled oscillator
VCO_DIV_M output for frequency divided VCO signal, −
VCO_DIV_P output for frequency divided VCO signal, +
VCO_RES_M VCO resonator, −
VCO_RES_P VCO resonator, +
VCO_TUNE tuning voltage for VCO
VCO_VAR_BIAS bias voltage for VCO varactor
VTUNE tuning voltage
XTO quartz

The invention claimed is:

1. A calibration apparatus for a tuneable resonator of a delta-sigma modulator of the continuous time, band pass type, wherein the delta-sigma modulator is operable in a normal operating mode and a calibration mode, wherein in the normal operating mode the resonator is non-oscillating and in the calibration mode the resonator oscillates, and wherein the calibration apparatus comprises:
 a resonator driver capable of causing an oscillating behaviour in a resonator output signal,
 a reference signal source that provides a reference signal,
 a frequency detector that provides a frequency relation signal corresponding to the frequency relation between the resonator output signal and the reference signal, and
 a controller that controls the tuneable resonator in dependence from the frequency relation signal so as to reduce frequency deviation.

2. The calibration apparatus according to claim 1, wherein the resonator driver is a transconductance stage connected in parallel to the resonator.

3. The calibration apparatus according to claim 1, wherein the resonator driver is a transimpedance stage connected in series to resonator.

4. The calibration apparatus according to claim 1, further comprising a frequency divider that receives the resonator output signal and provides a frequency divided resonator signal to the frequency detector.

5. The calibration apparatus according to claim 1, wherein the controller is configured to perform a successive approximation algorithm for determining a control signal provided to the tuneable resonator.

6. The calibration apparatus according to claim 1, further comprising an oscillation detector, wherein during normal operating mode, the oscillation detector that receives the resonator output signal and provides an oscillation indicative signal to the controller, and wherein the controller determines a resonator driver command that adjusts the resonator driver to a setting close to a stability limit of the resonator.

7. The calibration apparatus according to claim 1, wherein the reference signal source comprises a phase-locked loop.

8. A delta-sigma modulator of the continuous-time, band pass type, comprising a tuneable resonator and a calibration apparatus for a tuneable resonator of a delta-sigma modulator of the continuous time, band pass type, wherein the delta-sigma modulator is operable in a normal operating mode and a calibration mode, wherein in the normal operating mode the resonator is non-oscillating and in the calibration mode the resonator oscillates, and wherein the calibration apparatus comprises:

a resonator driver capable of causing an oscillating behaviour in a resonator output signal, a reference signal source that provides a reference signal, a frequency detector that provides a frequency relation signal corresponding to the frequency relation between the resonator output signal and the reference signal, and a controller that controls the tuneable resonator in dependence from the frequency relation signal so as to reduce frequency deviation.

9. A computer program product embodied on a non-transitory computer-readable medium and comprising executable instructions for the manufacture of the calibration apparatus for a tuneable resonator of a delta-sigma modulator of the continuous time, band pass type, wherein the delta-sigma modulator is operable in a normal operating mode and a calibration mode, wherein in the normal operating mode the resonator is non-oscillating and in the calibration mode the resonator oscillates, and wherein the calibration apparatus comprises:

a resonator driver capable of causing an oscillating behaviour in a resonator output signal, a reference signal source that provides a reference signal, a frequency detector that provides a frequency relation signal corresponding to the frequency relation between the resonator output signal and the reference signal, and a controller that controls the tuneable resonator in dependence from the frequency relation signal so as to reduce frequency deviation.

10. A method for calibrating a tuneable resonator of a delta-sigma modulator of the continuous time, band pass type, wherein the delta-sigma modulator is operable in a normal operating mode and a calibration mode, wherein in the normal operating mode the resonator is non-oscillating and in the calibration mode the resonator oscillates, and wherein the method comprises:

causing a tuneable resonator output signal to oscillate at an oscillation frequency of the resonator;

providing a reference signal having a desired frequency or a fraction thereof, detecting a frequency deviation between the oscillation frequency and the desired frequency or the fraction thereof;

controlling the tuneable resonator in dependence from the frequency deviation signal so as to reduce frequency deviation.

11. A method according to claim 10, wherein controlling the tuneable resonator comprises performing a successive approximation algorithm.

12. A method according to claim 10, further comprising detecting a presence of an oscillation in the resonator output signal;

providing an oscillation indicative signal;

determining a resonator excitation setting, the resonator excitation setting being close to a stability limit of the tuneable resonator.

13. A non-transitory computer program product comprising instructions that enable a processor to carry out the method of claim 10.

14. The method of claim 10 comprising the step of operating the delta-sigma modulator in the normal mode.

* * * * *